(12) United States Patent
Wolfman et al.

(10) Patent No.: US 9,430,322 B2
(45) Date of Patent: Aug. 30, 2016

(54) DEVICE BASED WEAR LEVELING USING INTRINSIC ENDURANCE

(75) Inventors: Jonathan Wolfman, Santa Clara, CA (US); Dana Lee, Saratoga, CA (US); Jonathan Hsu, Newark, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 13/565,650

(22) Filed: Aug. 2, 2012

(65) Prior Publication Data

US 2014/0040681 A1 Feb. 6, 2014

(51) Int. Cl.
| | |
|---|---|
| *G06F 12/02* | (2006.01) |
| *G06F 11/10* | (2006.01) |
| *H04L 1/00* | (2006.01) |
| *G06F 11/30* | (2006.01) |
| *G01R 31/317* | (2006.01) |
| *G06F 12/06* | (2006.01) |
| *G11C 16/04* | (2006.01) |
| *G06F 11/07* | (2006.01) |
| *G06F 12/16* | (2006.01) |
| *G11C 16/34* | (2006.01) |
| *G11C 29/04* | (2006.01) |

(52) U.S. Cl.
CPC ....... *G06F 11/1048* (2013.01); *G06F 12/0246* (2013.01); *G11C 16/349* (2013.01); *G01R 31/3171* (2013.01); *G06F 11/07* (2013.01); *G06F 11/076* (2013.01); *G06F 11/30* (2013.01); *G06F 12/02* (2013.01); *G06F 12/06* (2013.01); *G06F 12/16* (2013.01); *G06F 2212/7211* (2013.01); *G11C 16/04* (2013.01); *G11C 16/34* (2013.01); *G11C 2029/0409* (2013.01); *H04L 1/0061* (2013.01)

(58) Field of Classification Search
CPC ....... G11C 16/34; G11C 16/04; G11C 16/06; G06F 11/07; G06F 12/02; G06F 11/30; G06F 12/06; G06F 12/16; G06F 12/00; G06F 13/00; G06F 11/076; G06F 2212/7211; G01R 31/3171; H04L 1/20; H04L 1/24; H04L 1/0061
USPC ........................................................ 714/704
See application file for complete search history.

(56) References Cited

U.S. PATENT DOCUMENTS

| | | | |
|---|---|---|---|
| 8,015,346 B2 | 9/2011 | Chen et al. | |
| 2009/0037645 A1* | 2/2009 | Hsieh | 711/103 |
| 2009/0106482 A1* | 4/2009 | Sarin | G06F 12/0246 711/103 |
| 2009/0300277 A1* | 12/2009 | Jeddeloh | G06F 12/0246 711/104 |
| 2010/0153616 A1 | 6/2010 | Garratt | |
| 2011/0029715 A1 | 2/2011 | Hu et al. | |
| 2011/0149650 A1 | 6/2011 | Huang et al. | |
| 2012/0124273 A1* | 5/2012 | Goss et al. | 711/103 |
| 2012/0198196 A1* | 8/2012 | Song | 711/170 |
| 2013/0007343 A1* | 1/2013 | Rub et al. | 711/103 |
| 2013/0094288 A1* | 4/2013 | Patapoutian et al. | 365/185.03 |
| 2013/0148401 A1* | 6/2013 | Fai et al. | 365/63 |
| 2013/0191700 A1* | 7/2013 | Griffin et al. | 714/759 |
| 2013/0326116 A1* | 12/2013 | Goss | G06F 12/0871 711/103 |

* cited by examiner

*Primary Examiner* — Albert Decady
*Assistant Examiner* — Christian Dorman
(74) *Attorney, Agent, or Firm* — Brinks Gilson & Lione

(57) ABSTRACT

A system for improving the management and usage of blocks based on intrinsic endurance may be used to improve memory usage for flash memory, such as a memory card. The overall card endurance may be extended by cycling blocks with higher intrinsic endurance over the lowest endurance target of the worst block. This may be accomplished by managing blocks with different intrinsic endurance values internally or by partitioning the blocks with different intrinsic endurance values externally for different usage.

20 Claims, 10 Drawing Sheets

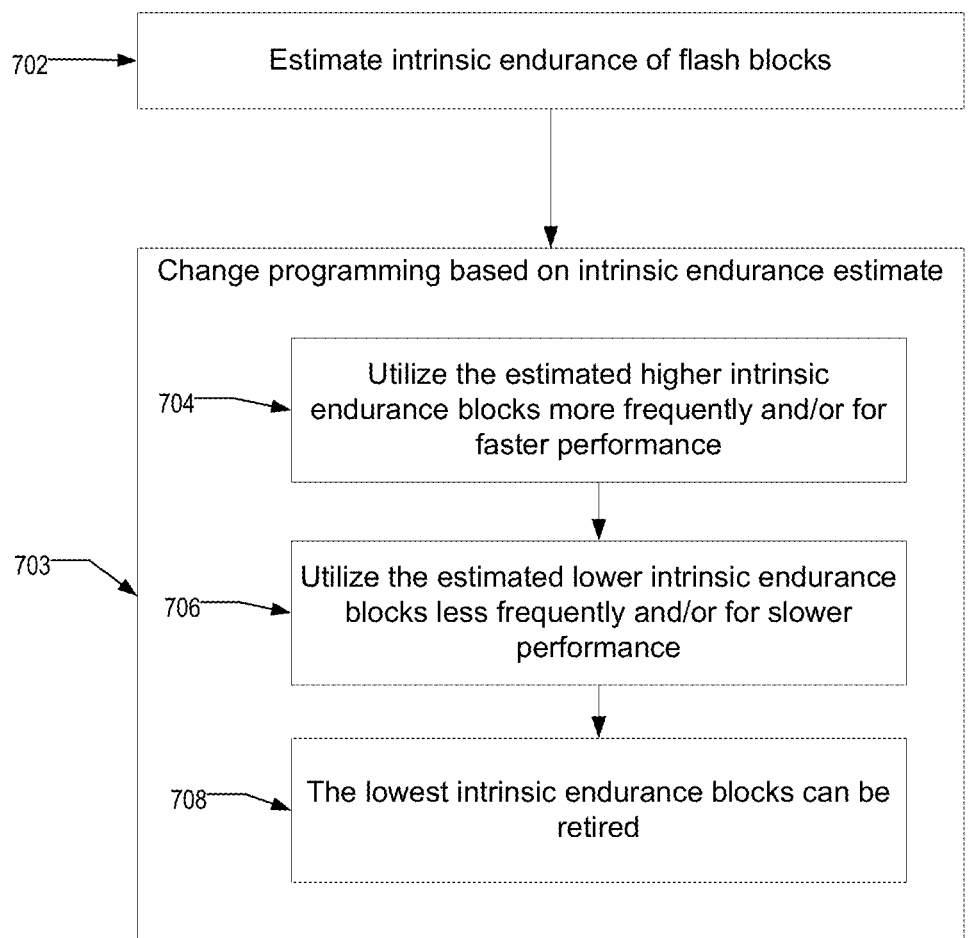

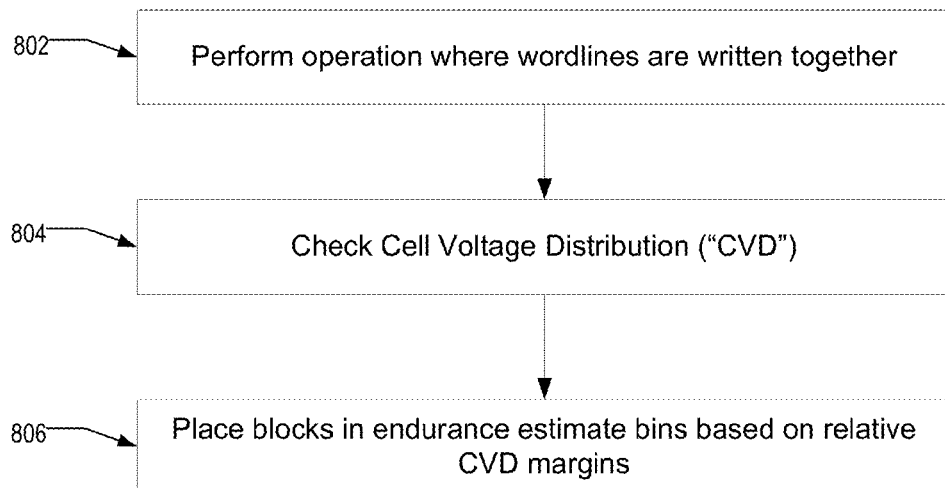
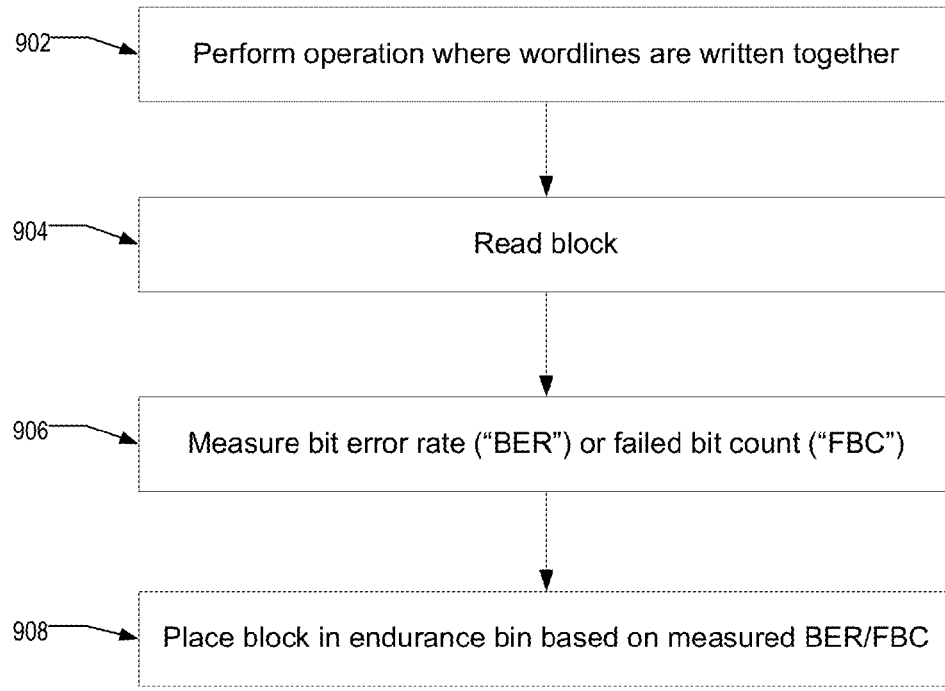

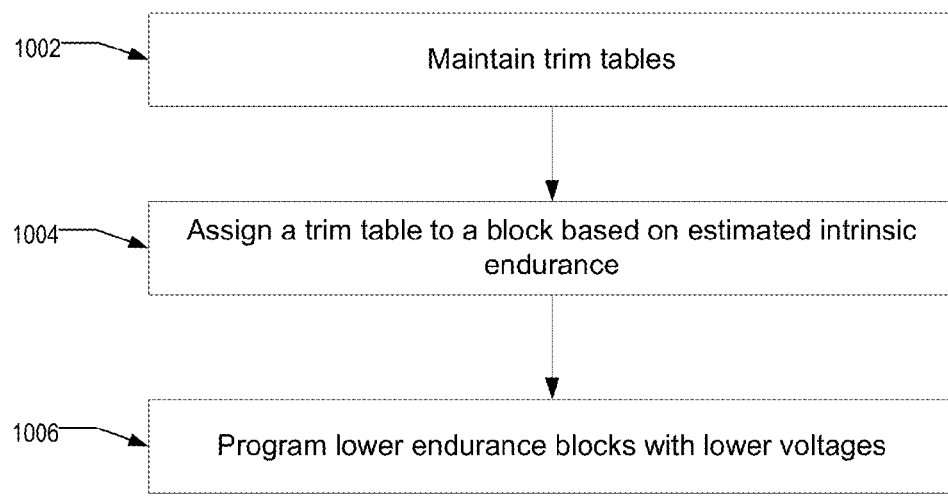
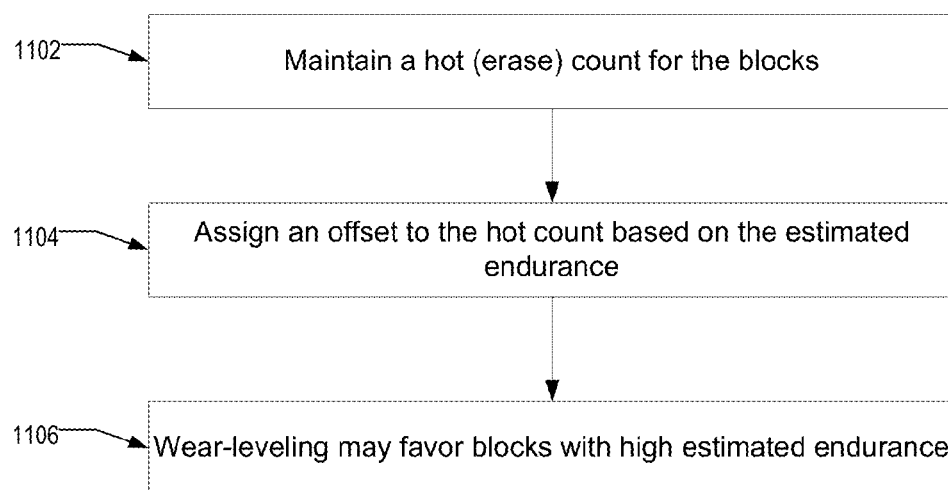

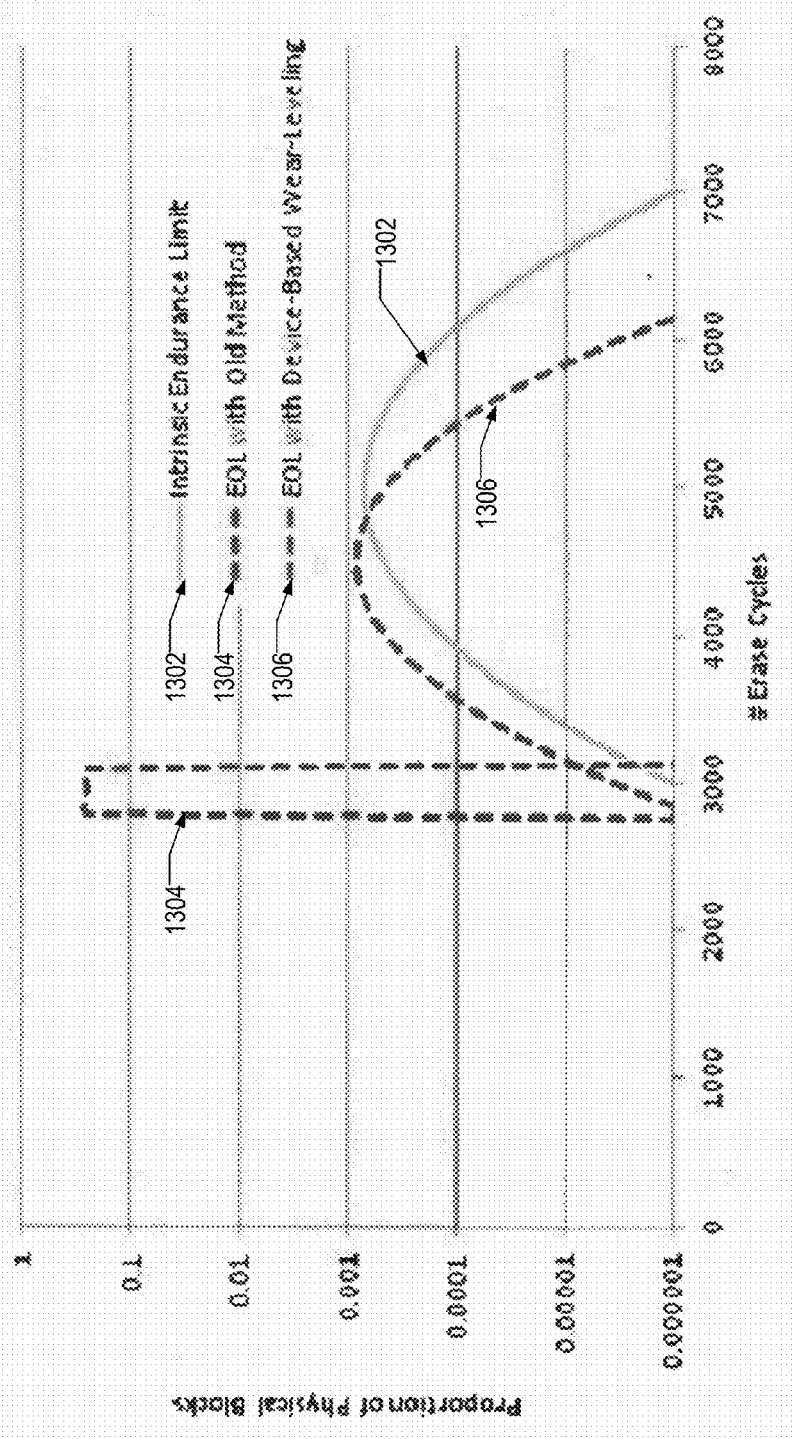

DEVICE BASED WEAR LEVELING USING INTRINSIC ENDURANCE

TECHNICAL FIELD

This application relates generally to memory devices. More specifically, this application relates to managing blocks of memory for improving endurance of non-volatile flash memory.

BACKGROUND

Non-volatile memory systems, such as flash memory, have been widely adopted for use in consumer products. Flash memory may be found in different forms, for example in the form of a portable memory card that can be carried between host devices or as a solid state disk (SSD) embedded in a host device. Identification of the endurance for blocks of memory may be necessary for decreasing the risk of losing stored data by writing to a block of memory that exceeded its estimated endurance. Flash erase cycle endurance may be limited based on the worst block in a system, which may limit the flash system reliability and write performance. For example, during wear-leveling, the controller may keep a count of the number of erase cycles each physical block endures and distributes new programs amongst the blocks such that all physical blocks reach the worst block's (i.e. lowest endurance block) cycle limit at approximately the same time. In other words, all blocks are ideally utilized (i.e. worn out) approximately equally until the lowest endurance block's limit is reached. Each system (e.g. card) may be limited by the block with the minimum intrinsic endurance. Once all blocks reached the specified cycle limit, further cycles implied that some blocks would not meet the minimum data retention requirement and the system may be considered unreliable.

SUMMARY

It may be desirable to reduce or negate the limitation that system endurance is judged by the lowest endurance of any flash block. A more accurate assessment of system endurance that is not tied to the lowest endurance block may result in faster programming (write performance) at the same flash endurance and/or higher yield of good/available blocks due to a more comprehensive flash endurance requirement. The overall system endurance may be extended by cycling blocks with higher intrinsic endurance over the lowest endurance target of the worst block. This may be accomplished by managing blocks with different intrinsic endurance values internally or by partitioning the blocks with different intrinsic endurance values externally for different usage. This management may be based on physical characteristics of the memory (e.g. card) that are measured during the lifetime (i.e., during the usage) of the memory. In other words, the management may be in real time rather than based on measurements/analysis immediately following fabrication. In particular, a monitoring or measurement of physical characteristics of memory blocks may be used for evaluating the endurance of those memory blocks.

According to a first aspect, a flash memory device includes a non-volatile storage having an array of memory blocks storing data. A controller in communication with the non-volatile storage is configured for estimating an intrinsic endurance for the memory blocks individually, and adjusting a usage patterns of the memory blocks based on the individual intrinsic endurance of the memory blocks.

According to a second aspect, a method is disclosed for writing to a multiple level cell ("MLC") flash memory in a non-volatile storage device having a controller and blocks of memory. The controller is configured to estimate an intrinsic endurance of the blocks of memory based on physical characteristics during usage of the non-volatile storage device, and adjust programming of the non-volatile storage device based on the estimated intrinsic endurance.

According to a third aspect, a memory system comprises a non-volatile storage having an array of memory blocks storing data and a controller in communication with the blocks. The controller is configured to predict an intrinsic endurance for the blocks, and modify the storing of data to one of the memory blocks based on the predicted intrinsic endurance of that memory block.

BRIEF DESCRIPTION OF THE DRAWINGS

FIG. 7 is a flow chart illustrating internal block management.

FIG. 8 is a flow chart illustrating one embodiment for intrinsic endurance estimation.

FIG. 9 is a flow chart illustrating another embodiment for intrinsic endurance estimation.

FIG. 10 is a flow chart illustrating one embodiment of programming changes based on the endurance estimation.

FIG. 11 is a flow chart illustrating another embodiment of programming changes based on the endurance estimation.

FIG. 13 is a diagram illustrating device-based wear-leveling results.

DETAILED DESCRIPTION

Figure 1:
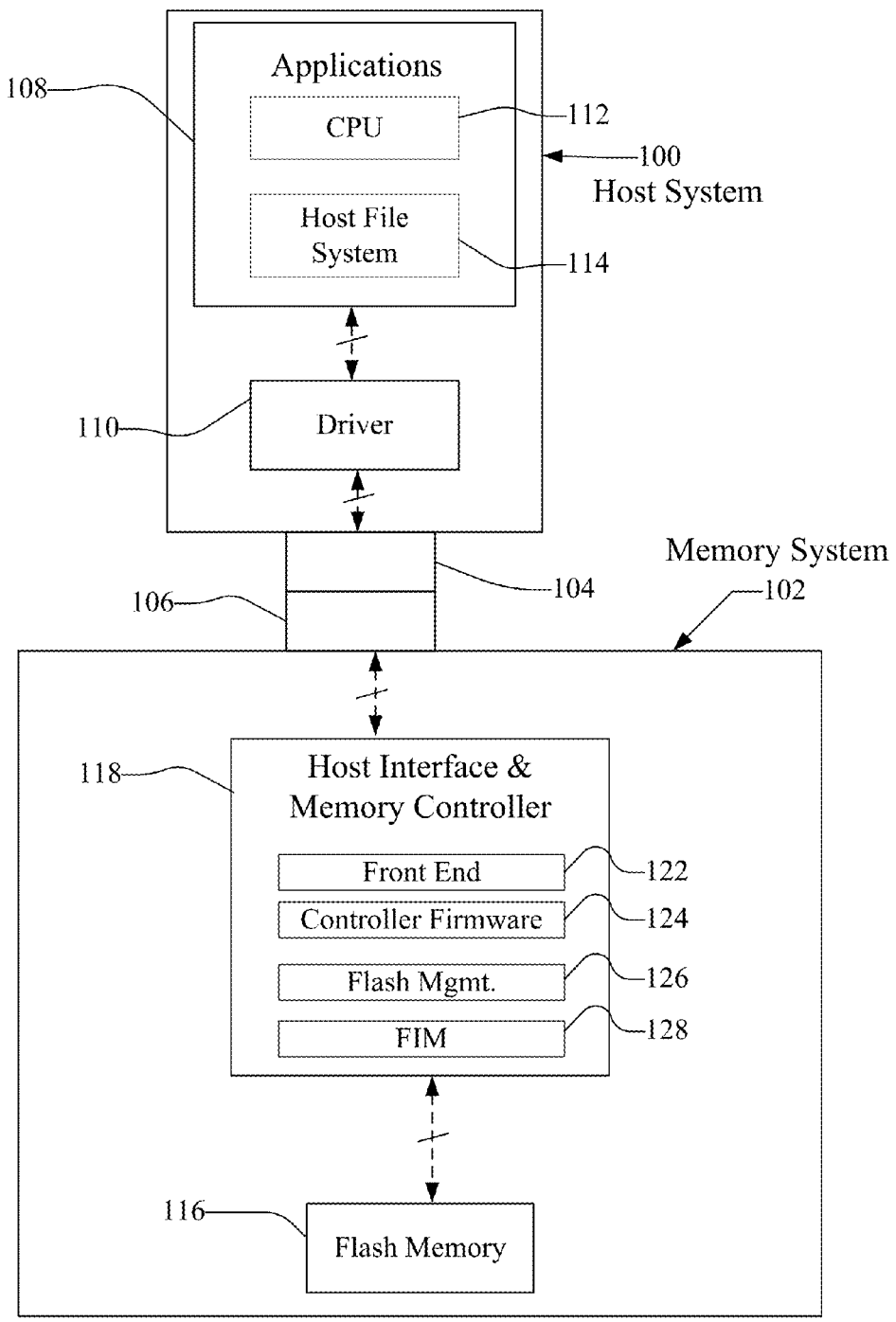
FIG. 1 is a block diagram of a host connected with a memory system having non-volatile memory.

A flash memory system suitable for use in implementing aspects of the invention is shown in FIGS. 1-6. A host system 100 of FIG. 1 stores data into and retrieves data from a flash memory 102. The flash memory may be embedded within the host, such as in the form of a solid state disk (SSD) drive installed in a personal computer. Alternatively, the memory 102 may be in the form of a flash memory card that is removably connected to the host through mating parts 104 and 106 of a mechanical and electrical connector as illustrated in FIG. 1. A flash memory configured for use as an internal or embedded SSD drive may look similar to the schematic of FIG. 1, with one difference being the location of the memory system 102 internal to the host. SSD drives may be in the form of discrete modules that are drop-in replacements for rotating magnetic disk drives.

Examples of commercially available removable flash memory cards include the CompactFlash (CF), the MultiMediaCard (MMC), Secure Digital (SD), miniSD, Memory Stick, SmartMedia, TransFlash, and microSD cards.

Although each of these cards may have a unique mechanical and/or electrical interface according to its standardized specifications, the flash memory system included in each may be similar. These cards are all available from SanDisk Corporation, assignee of the present application. SanDisk also provides a line of flash drives under its Cruzer trademark, which are hand held memory systems in small packages that have a Universal Serial Bus (USB) plug for connecting with a host by plugging into the host's USB receptacle. Each of these memory cards and flash drives includes controllers that interface with the host and control operation of the flash memory within them. As discussed below, the controllers may internally manage operations of the flash memory.

Host systems that may use SSDs, memory cards and flash drives are many and varied. They include personal computers (PCs), such as desktop or laptop and other portable computers, tablet computers, cellular telephones, smartphones, personal digital assistants (PDAs), digital still cameras, digital movie cameras, and portable media players. For portable memory card applications, a host may include a built-in receptacle for one or more types of memory cards or flash drives, or a host may require adapters into which a memory card is plugged. The memory system may include its own memory controller and drivers but there may also be some memory-only systems that are instead controlled by software executed by the host to which the memory is connected. In some memory systems containing the controller, especially those embedded within a host, the memory, controller and drivers are often formed on a single integrated circuit chip.

The host system 100 of FIG. 1 may be viewed as having two major parts, insofar as the memory 102 is concerned, made up of a combination of circuitry and software. They are an applications portion 108 and a driver portion 110 that interfaces with the memory 102. There may be a central processing unit (CPU) 112 implemented in circuitry and a host file system 114 implemented in hardware. In a PC, for example, the applications portion 108 may include a processor 112 running word processing, graphics, control or other popular application software. In a camera, cellular telephone or other host system 114 that is primarily dedicated to performing a single set of functions, the applications portion 108 includes the software that operates the camera to take and store pictures, the cellular telephone to make and receive calls, and the like.

The memory system 102 of FIG. 1 may include nonvolatile memory, such as flash memory 116, and a system controller 118 that both interfaces with the host 100 to which the memory system 102 is connected for passing data back and forth and controls the memory 116. The system controller 118 may convert between logical addresses of data used by the host 100 and physical addresses of the flash memory 116 during data programming and reading. The system controller 118 may retranslate logical addresses. Functionally, the system controller 118 may include a front end 122 that interfaces with the host system, controller logic 124 for coordinating operation of the memory 116, flash management logic 126 for internal memory management operations such as garbage collection, and one or more flash interface modules (FIMs) 128 to provide a communication interface between the controller with the flash memory 116. In one embodiment, the flash management logic 126 performs internal management of the blocks (e.g. estimating endurance and adjusting programming and card usage based on the endurance) as described with respect to FIGS. 7-11.

Figure 2:
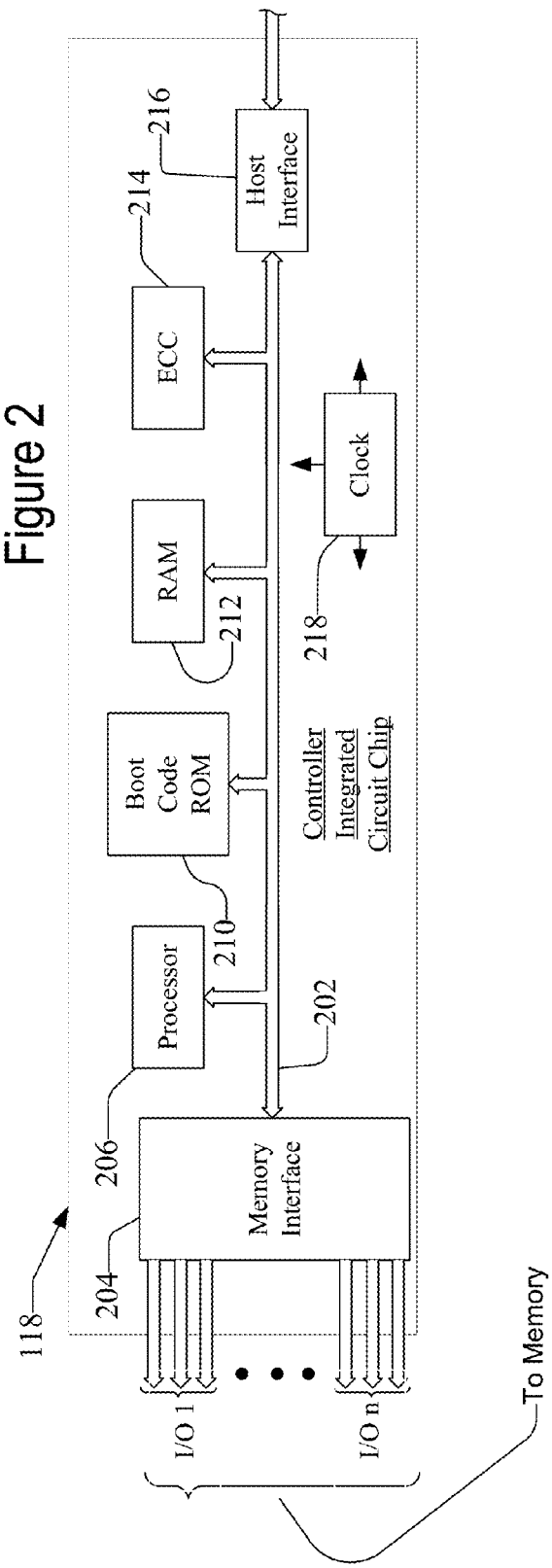
FIG. 2 is a block diagram of an exemplary flash memory system controller for use in the system of FIG. 1.

The system controller 118 may be implemented on a single integrated circuit chip, such as an application specific integrated circuit (ASIC) such as shown in FIG. 2. The processor 206 of the system controller 118 may be configured as a multi-thread processor capable of communicating via a memory interface 204 having I/O ports for each memory bank in the flash memory 116. The system controller 118 may include an internal clock 218. The processor 206 communicates with an error correction code (ECC) module 214, a RAM buffer 212, a host interface 216, and boot code ROM 210 via an internal data bus 202. The ROM 210 may be used to initialize a memory system 102, such as a flash memory device. The memory system 102 that is initialized may be referred to as a card. The ROM 210 in FIG. 2 may be a region of read only memory whose purpose is to provide boot code to the RAM for processing a program, such as the initialization and booting of the memory system 102. The ROM may be present in the ASIC rather than the flash memory chip.

Figure 3:
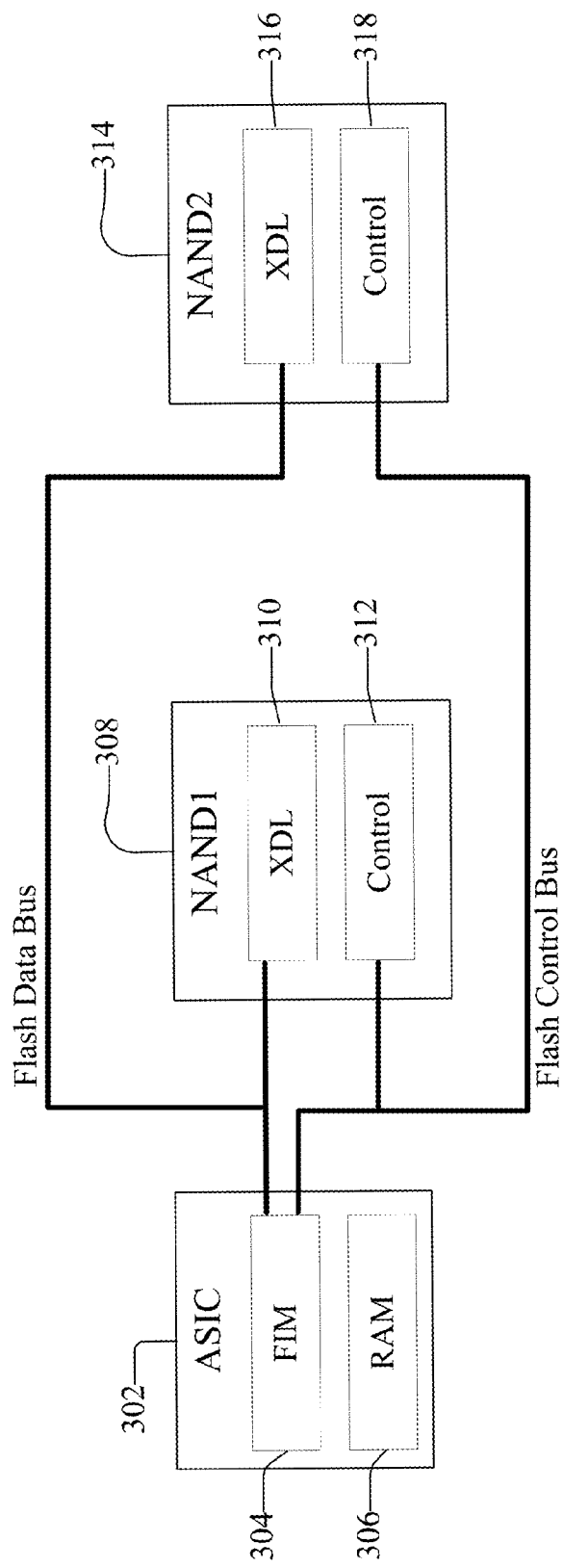
FIG. 3 is a block diagram of an alternative memory communication system.

FIG. 3 is a block diagram of an alternative memory communication system. An application-specific integrated circuit (ASIC) 302 may include a flash interface module (FIM) 304 and random access memory (RAM) 306. The ASIC 302 may be a chip that communicates with multiple flash memory modules or devices, such as NANDs 308, 314. The FIM 304 communicates data over the flash data bus and communicates control commands over the flash control bus. The NAND1 308 and NAND2 314 are types of flash memory that receive commands and data from the FIM 304 of the ASIC 302. Each of the NAND1 308 and NAND2 314 include controls 312, 318, respectively, for receiving control signals from the ASIC 302. Likewise, each of the NAND1 308 and NAND2 314 include an eXternal Data Latch (XDL) 310, 316, respectively, for receiving data signals from the ASIC 302. Although the flash data bus and flash control bus are illustrated as separate busses that communicate with the XDL 310, 316 and Control 312, 318 of the respective NANDs 308, 314, there may be a singular bus for communication.

Figure 4:
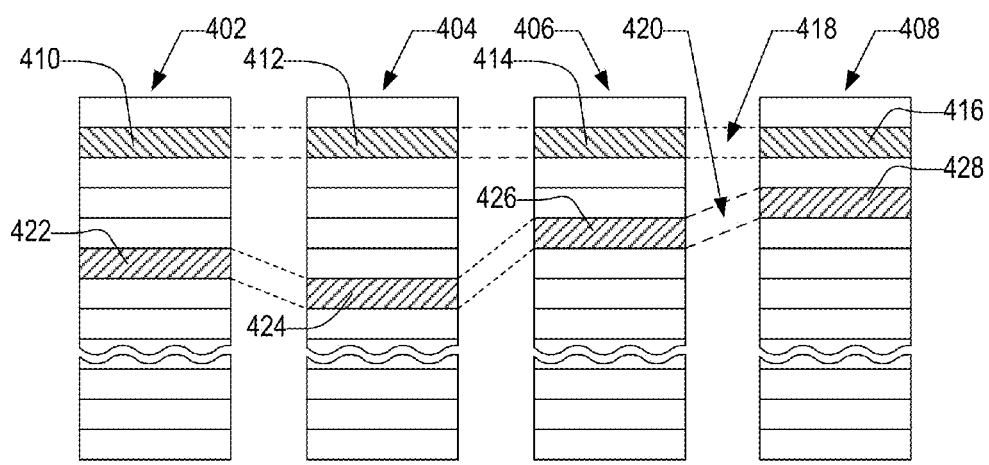
FIG. 4 is an example physical memory organization of the system of FIG. 1.

FIG. 4 conceptually illustrates an organization of the flash memory 116 (FIG. 1) as a cell array. The flash memory 116 may include multiple memory cell arrays which are each separately controlled by a single or multiple memory controllers 118. Four planes or sub-arrays 402, 404, 406, and 408 of memory cells may be on a single integrated memory cell chip, on two chips (two of the planes on each chip) or on four separate chips. The specific arrangement is not important to the discussion below. Of course, other numbers of planes, such as 1, 2, 8, 16 or more may exist in a system. The planes are individually divided into groups of memory cells that form the minimum unit of erase, hereinafter referred to as blocks. Blocks of memory cells are shown in FIG. 4 by rectangles, such as blocks 410, 412, 414, and 416, located in respective planes 402, 404, 406, and 408. There can be any number of blocks in each plane.

As mentioned above, the block of memory cells is the unit of erase, the smallest number of memory cells that are physically erasable together. For increased parallelism, however, the blocks may be operated in larger metablock units. One block from each plane is logically linked together to form a metablock. The four blocks 410, 412, 414, and 416 are shown to form one metablock 418. In one embodiment, the SZB is one or more metablocks. All of the cells within a metablock are typically erased together. The blocks used to form a metablock need not be restricted to the same relative locations within their respective planes, as is shown in a second metablock 420 made up of blocks 422, 424, 426, and 428. Although it may usually be preferable to extend the metablocks across all of the planes, for high system performance, the memory system may be operated with the ability to dynamically form metablocks of any or all of one, two or three blocks in different planes. This allows the size of the metablock to be more closely matched with the amount of data available for storage in one programming operation.

Figure 5:
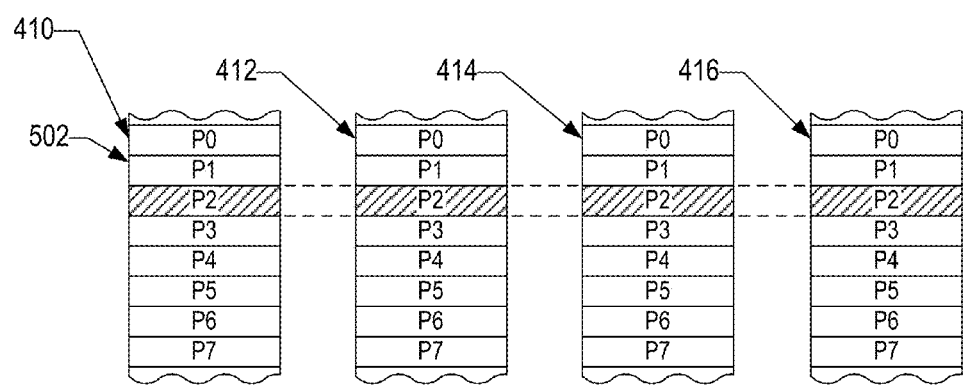
FIG. 5 is an expanded view of a portion of the physical memory of FIG. 4.

The individual blocks are in turn divided for operational purposes into pages of memory cells, as illustrated in FIG. 5. The memory cells of each of the blocks 410, 412, 414, and 416, for example, are each divided into eight pages P0-P7. Alternatively, there may be 16, 32 or more pages of memory cells within each block. The page is the unit of data programming and reading within a block, containing the minimum amount of data that are programmed or read at one time. However, in order to increase the memory system operational parallelism, such pages within two or more blocks may be logically linked into metapages. A metapage 502 is illustrated in FIG. 4, being formed of one physical page from each of the four blocks 410, 412, 414, and 416. The metapage 502, for example, includes the page P2 in each of the four blocks but the pages of a metapage need not necessarily have the same relative position within each of the blocks. A metapage may be the maximum unit of programming.

The memory cells may be operated to store two levels of charge so that a single bit of data is stored in each cell. This is typically referred to as a binary or single level cell (SLC) memory. Alternatively, the memory cells may be operated to store more than two detectable levels of charge in each charge storage element or region, thereby to store more than one bit of data in each. This latter configuration is referred to as multi level cell (MLC) memory. Both types of memory cells may be used in a memory, for example binary flash memory may be used for caching data and MLC memory may be used for longer term storage. The charge storage elements of the memory cells are most commonly conductive floating gates but may alternatively be non-conductive dielectric charge trapping material. In implementations of MLC memory operated to store two bits of data in each memory cell, each memory cell is configured to store four levels of charge corresponding to values of "11," "01," "10," and "00." Each bit of the two bits of data may represent a page bit of a lower page or a page bit of an upper page, where the lower page and upper page span across a series of memory cells sharing a common word line. Typically, the less significant bit of the two bits of data represents a page bit of a lower page and the more significant bit of the two bits of data represents a page bit of an upper page.

Figure 6:
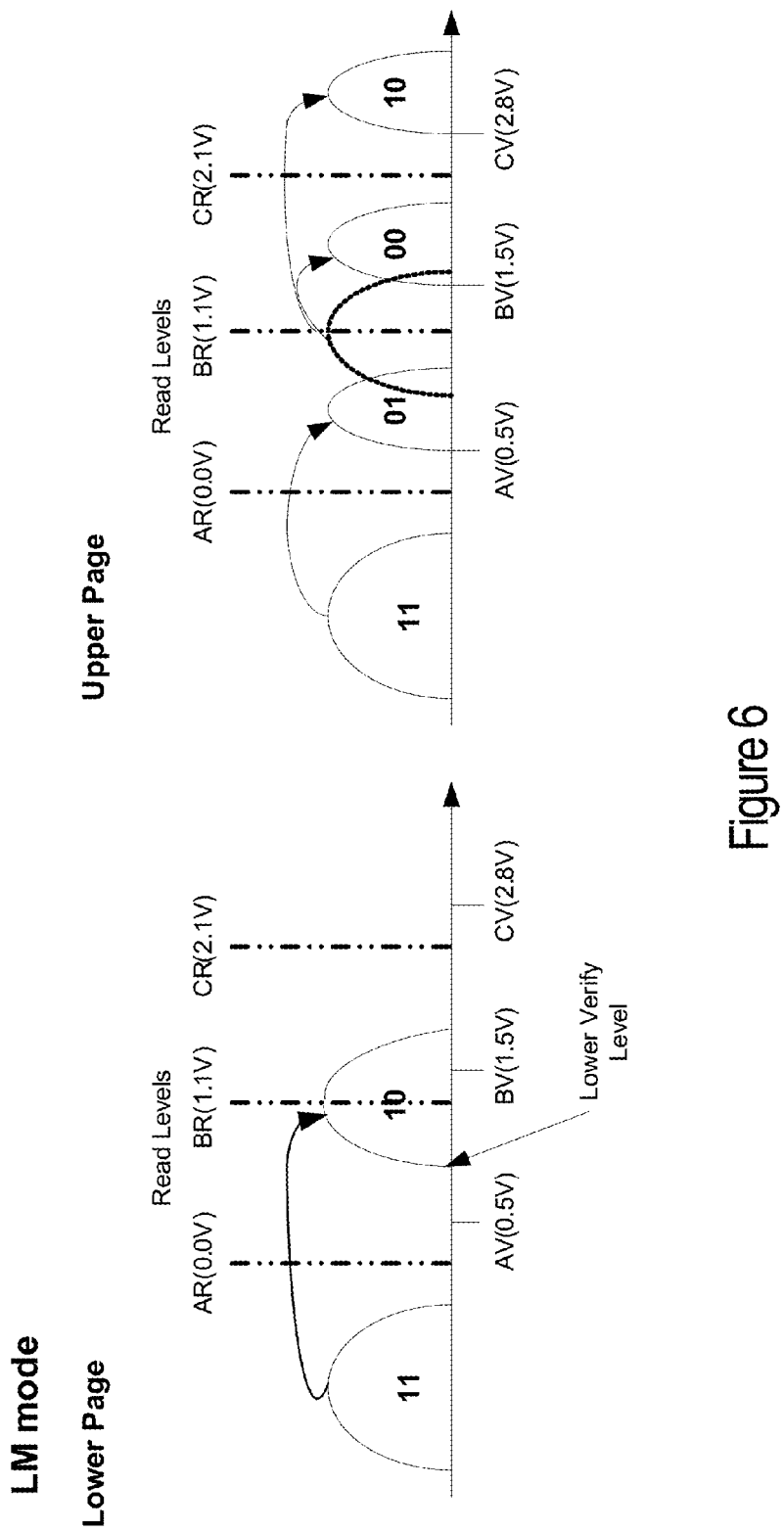
FIG. 6 is a diagram illustrating charge levels in a multi-level cell memory operated to store two bits of data in a memory cell.

FIG. 6 illustrates one implementation of the four charge levels used to represent two bits of data in an MLC memory cell. FIG. 6 is labeled as LM mode which may be referred to as lower at middle mode and will further be described below regarding the lower at middle or lower-middle intermediate state. The LM intermediate state may also be referred to as a lower page programmed stage. A value of "11" corresponds to an un-programmed state of the memory cell. When programming pulses are applied to the memory cell to program a page bit of the lower page, the level of charge is increased to represent a value of "10" corresponding to a programmed state of the page bit of the lower page. The lower page may be considered a logical concept that represents a location on a multi-level cell (MLC). If the MLC is two bits per cell, a logical page may include all the least significant bits of the cells on the wordline that are grouped together. In other words, the lower page is the least significant bits. For a page bit of an upper page, when the page bit of the lower page is programmed (a value of "10"), programming pulses are applied to the memory cell for the page bit of the upper page to increase the level of charge to correspond to a value of "00" or "10" depending on the desired value of the page bit of the upper page. However, if the page bit of the lower page is not programmed such that the memory cell is in an un-programmed state (a value of "11"), applying programming pulses to the memory cell to program the page bit of the upper page increases the level of charge to represent a value of "01" corresponding to a programmed state of the page bit of the upper page.

FIG. 7 is a flow chart illustrating internal block management. Internal block management may refer to managing the blocks within the memory device or card. The management may include management of wear-leveling based on physical characteristics of the memory device or card. Exemplary physical characteristics of the device or card that are monitored are described with respect to FIGS. 8-9. The management may include utilizing the memory or certain blocks differently (block 703). For example, blocks with higher estimated intrinsic endurance (based on physical characteristics) may be used more and/or with faster performance than blocks with lower estimated intrinsic endurance. Exemplary usage patterns or changes based on the characteristics are described in blocks 704-708, as well as with respect to FIGS. 10-11. Intrinsic endurance may be the number of times that a block can be written to and erased before becoming unreliable.

FIG. 7 illustrates that the card's controller may manage the blocks internally, compared with external management by the host as in FIG. 12, discussed below. In one example, the flash management 126 of the memory system 102 performs the management illustrated in FIGS. 7-11. Management may refer to the different processing, programming, or usage that is performed on or with memory blocks based on the observed physical characteristics of the blocks. The observed physical characteristics of the blocks may be used to estimate intrinsic endurance of memory blocks as in block 702. The intrinsic endurance estimate may be utilized for programming changes in block 703. The different utilization or programming changes in block 703 may also be referred to as adjustments, such that FIG. 7 illustrates an estimation 702 and adjustment 703. Blocks 704-708 are exemplary changes based on the intrinsic endurance estimate that may be applied individually or as a group. In other embodiments, each of the changes may be applied independently or they may be applied simultaneously. Different changes may be applied for different blocks, such as certain criteria for SLC vs. MLC. The memory blocks with a higher estimated intrinsic endurance may be utilized more frequently or for applications requiring a faster performance as in block 704. Likewise, the memory blocks with a lower estimated intrinsic endurance may be utilized less frequently or for applications that do not require a faster performance as in block 706. The lowest endurance blocks may be retired as in block 708. As exemplary embodiments, higher endurance may include a top 50% of blocks, while the lowest could be the bottom 20% or the bottom 1% as just a few examples. The specific values may depend on multiple factors, like product type, acceptable risk of data loss and more. In other words, the blocks identified as having the worst endurance would not be utilized and the data would be copied to another block. Block 703 illustrates usage patterns for blocks based on the estimated intrinsic endurance. Additional examples of usage patterns or programming changes are described with respect to FIGS. 10-11.

FIG. 8 is a flow chart illustrating one embodiment for intrinsic endurance estimation. In particular, FIG. 8 is one embodiment of the physical characteristics that are measured for estimating intrinsic endurance of memory blocks in block 702 of FIG. 7. The intrinsic endurance estimate in FIG. 8 may be determined after an operation where wordlines are written together as in block 802. Garbage collection or folding are examples of operations where all wordlines in a block are written at approximately the same time.

In block 804, Cell Voltage Distribution ("CVD") is checked. CVD may measure the space between state distributions. The CVD changes the read voltage and measures the distribution of threshold voltages versus the number of bits or the number of cells. It may be the number of bits versus the threshold voltage, from which the margin may be calculated based on how much space there is between the bits. For example, a program state on an SLC may be at the threshold voltage of anywhere from three volts to five volts, and an erase cell may have from negative two volts to zero voltage. Accordingly, the space in between that goes from zero volts to three volts is the margin. This embodiment may also apply to MLC as well as SLC.

The margin may be an indication of endurance. The more space (i.e. greater margin), the greater the voltage separation in between programs and erase operations, so the likelihood of losing data is reduced. However, when voltage levels for the program state and erase state overlap, the data cannot be read anymore. The smaller the margin, the greater the chance of failure. For example, if the three volts moves to one volt, and on the erase side that started out at zero moves up to one-and-a-half, then the block cannot be read. Accordingly, the measured space between state distributions for the CVD may be used to assign blocks to endurance estimate bins as in block 806. The bins may reflect the voltage differences. For example, the bins may be for 3 volts, 2 volts, 1 volt, and 0 volts, with the higher voltage bins containing a list of blocks with better endurance. The 0 volt bin may contain a list of the lowest endurance or defective blocks.

FIG. 9 is a flow chart illustrating another embodiment for intrinsic endurance estimation. In particular, FIG. 9 is one embodiment of the physical characteristics that are measured for estimating intrinsic endurance of memory blocks in block 702 of FIG. 7. The intrinsic endurance estimate in FIG. 9 may be determined after an operation where wordlines are written together as in block 902. A block is read in block 904 and the bit error rate ("BER") or failed bit count ("FBC") is measured in block 906. In particular, the controller may identify the number of error bits by determining how many bits have crossed over into the next state using error correction codes ("ECC") or other methods. Enhanced post-write-read error management ("EPWR") may also be used. The failed bit count may be used for assigning blocks to bins for the estimated intrinsic endurance as in block 908. The higher the percentage of failed bits in a block, the worse the endurance is estimated to be. Likewise, a block with few or no failed bits will be assigned to a bin for high endurance blocks. In one embodiment, the number of failed bits may be a bin, where the bin with 0 failed bits is best, 1 failed bit is good intrinsic endurance, while the higher bit error bins reflect poor estimated intrinsic endurance.

FIG. 10 is a flow chart illustrating one embodiment of programming changes based on the endurance estimation. FIGS. 8-9 illustrate embodiments for estimating intrinsic endurance, while FIG. 10 illustrates one embodiment for utilizing that information. For example, FIG. 10 may be an alternative embodiment for a programming change 703 from FIG. 7. In block 1002, trim tables may be maintained with programming parameters (e.g. wordline voltages, programming times). A trim table may include a listing of programming parameters that can be changed depending on the estimated intrinsic endurance. In other words, the trim table may include instructions for which parameters may be modified based on the known endurance values for particular blocks. A trim table may be assigned to a block based on the block's endurance estimate bin as in block 1004. Blocks with lower estimated endurance would be programmed with lower voltages as in block 1006, so that even though the programming speed may be lower, the stress to the silicon may be reduced. The reduced stress may be a trade off with program time or speed, so the programming parameter changes from the trim table may be utilized to minimize the stress or usage of certain blocks at the expense of programming speed. The programming change in FIG. 10 may be implemented during memory qualification, so the memory may be qualified with a higher endurance rating and/or improved endurance. In other words, the endurance benefits can be verified using existing qualification methodology, and the results of the qualification tests may be reported to potential customers. Qualification tests may simulate the life of a part in a lab environment.

FIG. 11 is a flow chart illustrating another embodiment of programming changes based on the endurance estimation. FIGS. 8-9 illustrate embodiments for estimating intrinsic endurance, while FIG. 11 illustrates one embodiment for utilizing that information. For example, FIG. 11 may be an alternative embodiment for a programming change 703 from FIG. 7. A hot count or an erase count may be maintained for the blocks as in block 1102. An offset may be assigned to the hot count based on the estimated intrinsic endurance as in block 1104. In particular, the hot count reflects the usage of a particular block, however, that count may be modified based on the estimated endurance. For example, blocks with higher estimated endurance may have their hot count reduced since they are more likely to last longer. Likewise, blocks with a low estimated endurance may have their hot count increased to ensure that they are more likely to be avoided for reading/writing. In one embodiment, there may be a modified/offset hot count value in addition to the actual hot count. In other words, the actual hot count is still maintained, but for decision-making purposes, the offset hot count is used because it better reflects the health of a block. In alternative embodiments, the actual hot count may be offset or modified. The existing wear-leveling controller may favor blocks with high estimated endurance over those blocks with lower estimated endurance as in block 1106.

Figure 12:
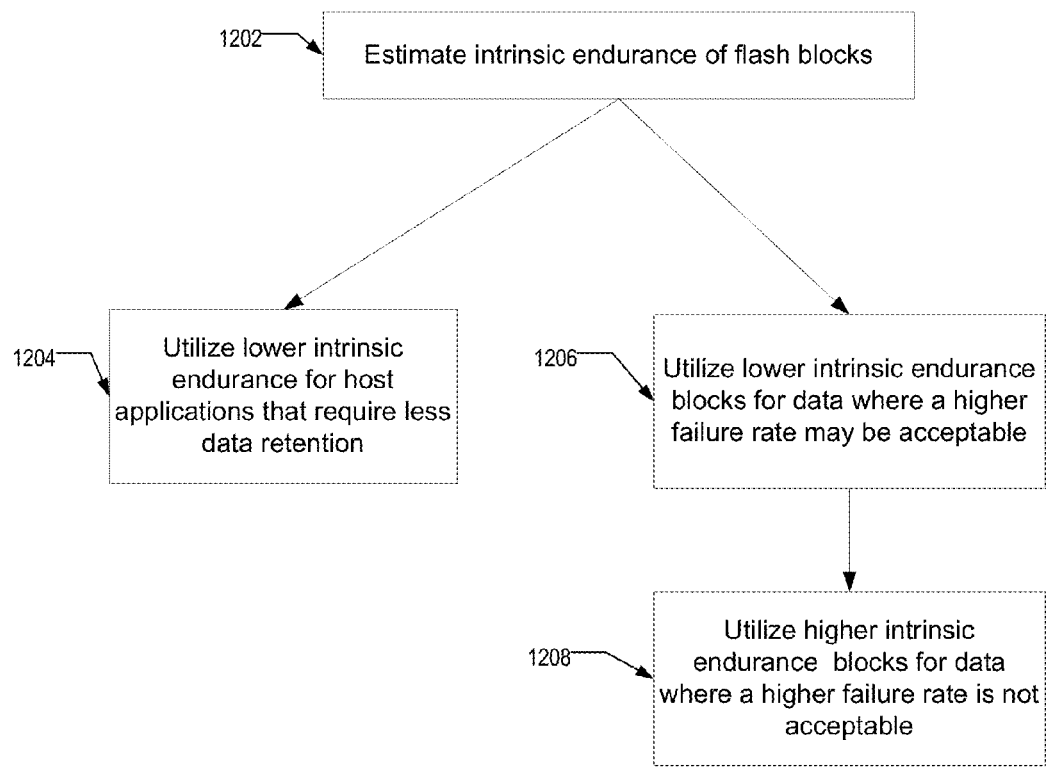
FIG. 12 is a flow chart illustrating external block management.

FIG. 12 is a flow chart illustrating external block management. The external management may refer to the host (e.g. host system 100) managing the blocks. The external management may also refer to the assignment of data to physical blocks (as opposed to internal management that may focus on distribution of cycles between blocks). The assignment of data to physical blocks may be from the host. For example, the host system 100 may estimate block intrinsic endurances and adjust programming or memory usage based on the endurances. In one embodiment, the blocks may be partitioned by the host based on the estimated intrinsic endurance values. The intrinsic endurance may be estimated as in block 1202. The intrinsic endurance estimate may be the same as block 702 in FIG. 2 or may be the same as the estimation process from FIGS. 8-9. Based on the estimated intrinsic endurance, the card can be utilized or programmed differently. For example, blocks that have a lower intrinsic endurance target may be utilized for host applications that require less data retention as in block 1204.

Exemplary host applications that require less data retention may include caching operations or temporary storage. Alternatively, blocks 1206-1208 illustrate that the estimated intrinsic endurance may be used for determining which data is stored at a particular block. Lower intrinsic endurance blocks may be used for data where a higher rate of failure may be acceptable as in block 1206, while higher intrinsic endurance blocks may be used for data where a higher failure rate is not acceptable. For example, applications where the host provides additional protection such as RAID or backup copies may accept a slightly higher failure rate, so the lower intrinsic endurance blocks may be used for those applications.

The application of the estimates and adjustments discussed above may be implemented on a group of blocks basis. For example, meta-blocks may be analyzed for the estimates and subsequent adjustment to programming. Alternatively, the implementation may be through top/middle/bottom blocks or die-by-die. FIGS. 4-5 illustrate alternative grouping of blocks that may be utilized for the implementations discussed above. In addition, the implementation may occur even after a significant portion of a car's lifetime has passed. In other words, the estimate and adjustment may be performed even after significant hot count (e.g. 2000 cycles).

As described, a probabilistic distribution of raw flash block endurance is considered when implementing wear-leveling. Estimates are made as to where specific flash blocks lie within the distribution using CVD and/or BER, for example. This may allow a card to achieve a higher number of total write/erase cycles because each block may be cycled to its own intrinsic limit.

FIG. 13 is a diagram illustrating device-based wear-leveling results. Line 1302 illustrates an actual intrinsic endurance limit. Line 1304 illustrates the end of life ("EOL") wear limit from traditional wear leveling. As shown, the traditional wear-leveling may treat all or groups of physical blocks as having an endurance limit equal to the block with the lowest endurance (e.g. 3000 erase cycles), which results in all the blocks reaching EOL at that same limit. Line 1306 illustrates device-based wear-leveling with an estimated intrinsic endurance that is applied differently for blocks. In other words, the blocks are utilized based on the estimated intrinsic endurance of blocks individually, rather than assuming that all blocks have the same endurance limit as in line 1304. Line 1304 illustrates that the total amount of data that could be written and reliably stored on a card was (Lowest Cycle Limit)×(Card Capacity), however, with device-based wear-leveling 1306, the potential total write and stored data is (Average Cycle Limit)×(Card Capacity). Accordingly, when the ratio of (Average Cycle Limit)/(Lowest Cycle Limit) is high the card will have significantly improved endurance limit as a whole.

A "computer-readable medium," "machine readable medium," "propagated-signal" medium, and/or "signal-bearing medium" may comprise any device that includes, stores, communicates, propagates, or transports software for use by or in connection with an instruction executable system, apparatus, or device. The machine-readable medium may selectively be, but not limited to, an electronic, magnetic, optical, electromagnetic, infrared, or semiconductor system, apparatus, device, or propagation medium. A non-exhaustive list of examples of a machine-readable medium would include: an electrical connection "electronic" having one or more wires, a portable magnetic or optical disk, a volatile memory such as a Random Access Memory "RAM", a Read-Only Memory "ROM", an Erasable Programmable Read-Only Memory (EPROM or Flash memory), or an optical fiber. A machine-readable medium may also include a tangible medium upon which software is printed, as the software may be electronically stored as an image or in another format (e.g., through an optical scan), then compiled, and/or interpreted or otherwise processed. The processed medium may then be stored in a processor, memory device, computer and/or machine memory.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized.

Accordingly, the disclosure and the figures are to be regarded as illustrative rather than restrictive.

We claim:

1. A flash memory device comprising:
    a non-volatile storage having an array of memory blocks; and
    a controller in communication with the non-volatile storage, wherein the controller is configured to:
        estimate an intrinsic endurance based on physical characteristics during usage for the memory blocks individually;
        assigning bins for the memory blocks based on the intrinsic endurance, wherein the bins reflect relative endurance of the memory blocks; and
        adjust usage patterns of the memory blocks based on the assigned bin for each of the memory blocks, wherein the adjustment of usage patterns comprises managing wear leveling based on the assigned bins and comprises adjusting trim parameters based on the assigned bins.

2. The device of claim 1 wherein to estimate the intrinsic endurance, the controller is configured to:
    measure cell voltage distribution; and
    assign the intrinsic endurance based on the measured cell voltage distribution, wherein each of the bins each corresponds with a different value of the measured cell voltage distribution.

3. The device of claim 1 wherein to estimate the intrinsic endurance, the controller is configured to:
measure a number of failed bits; and
assign the intrinsic endurance based on the number of failed bits, wherein each of the bins corresponds with a different number of failed bits.

4. The device of claim 3 wherein the number of failed bits is measured with enhanced post-write read, bit error rate, or failed bit count.

5. The device of claim 1 wherein estimation and adjustment are performed during usage of the device.

6. The device of claim 1 wherein the adjustment of the usage patterns further comprises:
programming the memory blocks with a lower estimated intrinsic endurance using a lower voltage; and
retiring the memory blocks with a lowest estimated intrinsic endurance.

7. The device of claim 1 wherein the trim parameters are established in a trim table that is assigned to a block, further wherein the adjustment of usage further comprises:
assigning a trim table to a block based on the bin, wherein blocks with a lower intrinsic endurance are assigned a trim table with less wear including a lower programming voltage or a slower programming speed.

8. The device of claim 1 wherein the adjustment of the usage patterns further comprises:
measuring a hot count for individual blocks of erase operations that reflects actual usage of those blocks; and
offsetting the hot count based on the estimated endurance, wherein the hot count is reduced for those blocks with a high estimated endurance and the hot count is increased for those blocks with a low estimated endurance.

9. The device of claim 1 wherein the adjustment of usage further comprises:
receiving requests for host operations, wherein host operations that require less data retention are assigned to the memory blocks with lower estimated intrinsic endurance.

10. The device of claim 1 wherein the adjustment of usage further comprises:
assigning blocks with lower estimated intrinsic endurance to data with additional data backup protections, wherein the additional data backup protections comprise RAID or backup copies.

11. The device of claim 1 wherein the adjustment of usage further comprises:
assigning the blocks based on a host application that utilizes the blocks, wherein lower intrinsic endurance blocks are utilized for host applications that require less data retention.

12. A method for block level grading in flash memory comprising:
in a non-volatile storage device having a controller and blocks of memory, the controller is configured for:
measuring a cell voltage distribution;
estimating an intrinsic endurance of individual blocks of memory based on the cell voltage distribution during usage of the non-volatile storage device, wherein the cell voltage distribution comprises a physical characteristic that reflects the intrinsic endurance of the individual block;
assigning bins for each of the blocks of memory based on the intrinsic endurance reflected by the cell voltage distribution, wherein the bins correspond with values of the cell voltage distribution; and
adjusting programming of the non-volatile storage device based on the assigned bin, wherein the programming that is adjusted comprises using a lower voltage for the memory blocks in one or more of the bins that correspond with a lower value of the intrinsic endurance and comprises using a higher voltage for the memory blocks in one or more of the bins that correspond with a higher value of the intrinsic endurance.

13. The method of claim 12 wherein each of the bins each corresponds with a different value of the cell voltage distribution.

14. The method of claim 13 wherein the cell voltage distribution is measured after an operation where wordlines in a block are written together.

15. The method of claim 12 wherein the adjusting programming comprises using additional data backup protections for the memory blocks in one or more of the bins that correspond with a lower value of the intrinsic endurance.

16. The method of claim 15 wherein the additional data backup protections are not used for the memory blocks in one or more of the bins that correspond with a higher value of the intrinsic endurance.

17. The method of claim 12 wherein the using a lower voltage comprises programming the memory blocks with a lower estimated endurance with the lower voltage.

18. A method for operating a memory system that includes an array of memory blocks and a controller in communication with the memory blocks, the method comprising:
determining a cell voltage distribution or a count of failed bits for the block;
predicting an intrinsic endurance for the blocks based on the determined cell voltage distribution or based on the count of failed bits;
providing the predicted intrinsic endurance to a host;
partitioning, by the host, the blocks based on the intrinsic endurance; and
receiving, from the host, assignments of data based on the partitioning from the intrinsic endurance provided, wherein blocks with a higher intrinsic endurance are assigned data that requires higher data retention and blocks with a lower intrinsic endurance are assigned data that requires less data retention, wherein the blocks are partitioned by the host.

19. The memory system of claim 18 wherein the external block management comprises the host utilizing blocks with a lower intrinsic endurance for applications with a higher tolerance for a failure rate.

20. The memory system of claim 18 wherein the external block management comprises the host managing wear leveling based on the predicted intrinsic endurance.

* * * * *